(12) United States Patent
Lebouleux et al.

(10) Patent No.: US 6,215,361 B1
(45) Date of Patent: *Apr. 10, 2001

(54) PHASE-LOCKED LOOP WITH A CHARGE PUMP CURRENT LIMITING DEVICE

(75) Inventors: Nicolas Lebouleux, Grenoble; Philippe Berger, Crolles; Eric Cirot, Fontaine, all of (FR)

(73) Assignee: SGS-Thomson Microelectronics S.A., Gentilly (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/922,747

(22) Filed: Sep. 3, 1997

(30) Foreign Application Priority Data

Sep. 9, 1996 (FR) .................................................. 96 11221

(51) Int. Cl.[7] ..................................................... H03L 7/095
(52) U.S. Cl. ...................... 331/17; 331/DIG. 2; 331/1 A; 327/536; 327/157
(58) Field of Search ................................ 331/DIG. 2, 20, 331/1 A, 17; 327/162, 536, 157

(56) References Cited

U.S. PATENT DOCUMENTS

| 4,745,372 | * | 5/1988 | Miwa | 331/8 |
|---|---|---|---|---|
| 4,987,387 | | 1/1991 | Kennedy et al. | 331/1 A |
| 5,497,127 | | 3/1996 | Sauer | 331/17 |
| 5,699,020 | * | 12/1997 | Jefferson | 331/17 |
| 5,719,532 | * | 2/1998 | Nayebi et al. | 331/20 |
| 5,724,007 | * | 3/1998 | Mar | 331/1 A |

FOREIGN PATENT DOCUMENTS

| 0 218 508 | 4/1987 | (EP) | H03L/7/18 |
|---|---|---|---|
| 2 257 587 | 1/1993 | (GB) | H03B/13/00 |

OTHER PUBLICATIONS

French Search Report from French Patent Application 96 11221, filed Sep. 9, 1996.

* cited by examiner

Primary Examiner—Arnold Kinkead
(74) Attorney, Agent, or Firm—Wolf, Greenfield & Sacks, P.C.; James H. Morris; Theodore E. Galanthay

(57) ABSTRACT

The present invention relates to a phase-locked loop including a comparator and a charge pump. The comparator compares the phases of an input pulse signal and of a reference pulse signal and generates charge and discharge control signals, the charge pump being capable of charging or discharging the capacitive filter according to the charge and discharge control signals. The filter is charged or discharged when these signals are in a first state and insulated from the charge pump when they are in a second state. The loop includes a device for limiting the charge and discharge current of the capacitive filter, this device including windowing circuits for limiting the time during which the charge and discharge control signals are in the first state.

31 Claims, 6 Drawing Sheets

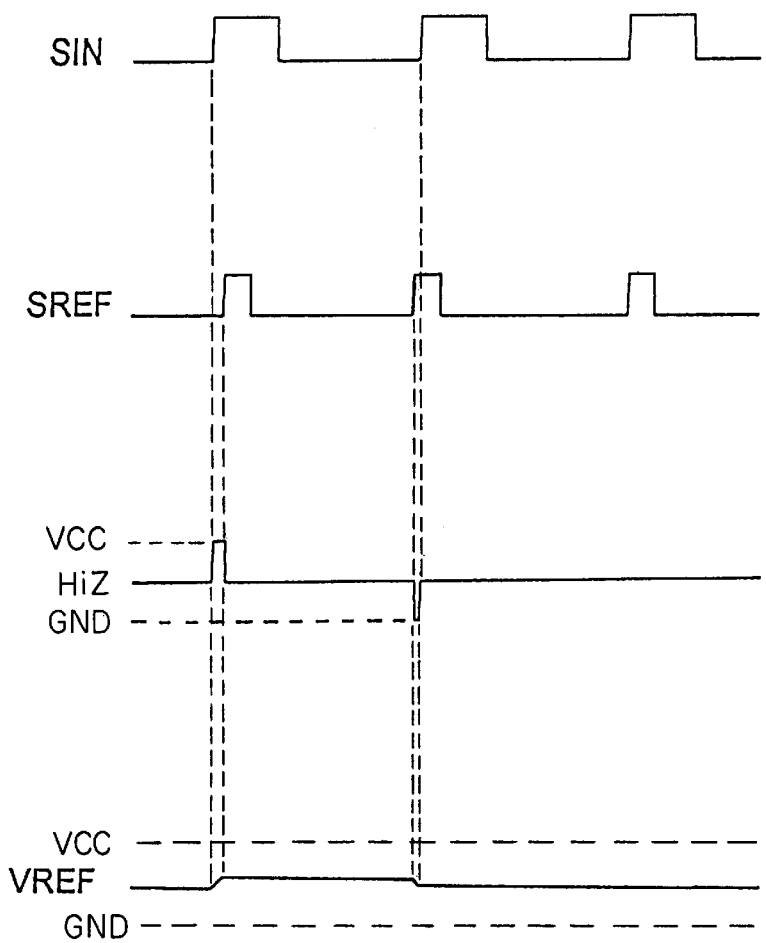
FIG. 5a (PRIOR ART)
FIG. 5b (PRIOR ART)
FIG. 5c (PRIOR ART)
FIG. 5d (PRIOR ART)
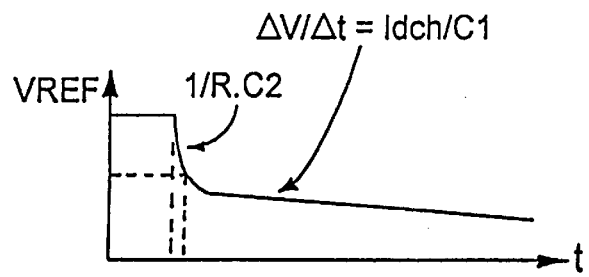
FIG. 6 (PRIOR ART)

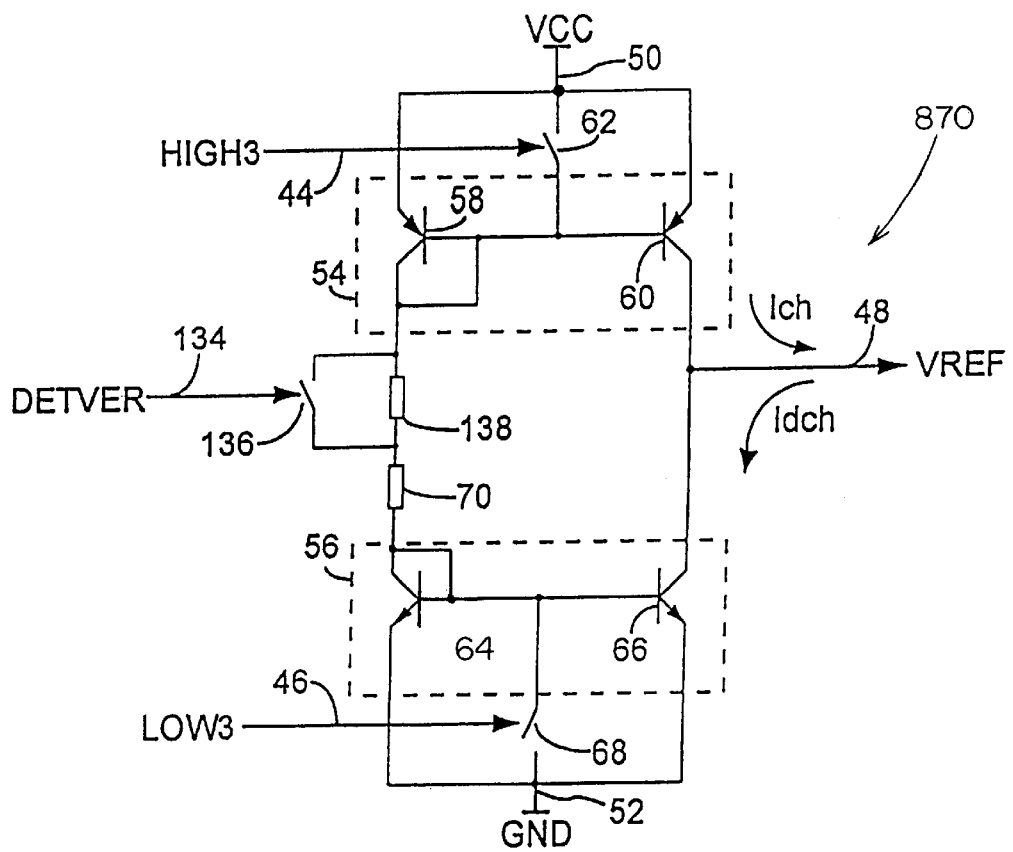
FIG. 12
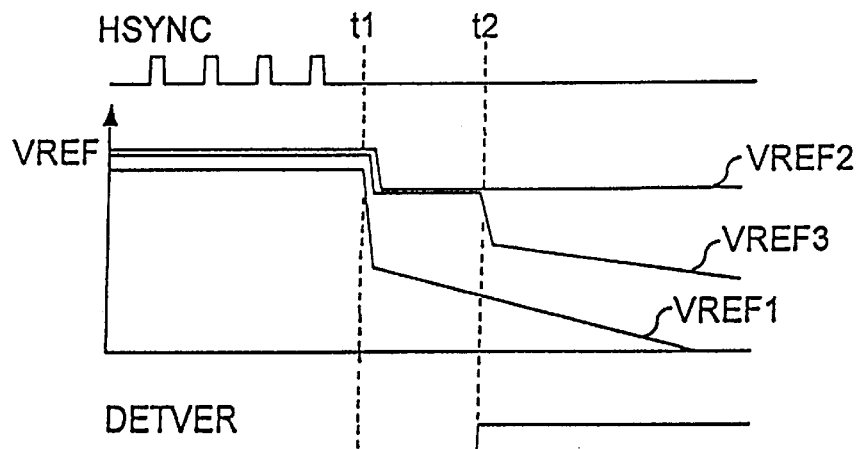
FIG. 13a
FIG. 13b
FIG. 13c

PHASE-LOCKED LOOP WITH A CHARGE PUMP CURRENT LIMITING DEVICE

BACKGROUND OF THE INVENTION

1. Field of the Invention

The present invention relates to a phase-locked loop including a device for limiting the charge pump current. It applies, for example, to the field of processing of synchronization signals relative to display on screens.

2. Discussion of the Related Art

To control the display of data and images on a monitor or a television screen and, more specifically, to control the scanning of an electron beam on a screen, synchronization signals are used. These synchronization signals add to the effective signal, that is, to the signal representative of the data or images to be displayed. They contain time information that enables spotting the beginning of lines (horizontal synchronization) and the beginning of frames (vertical synchronization). According to these signals, deflectors which direct the electron beam scanning the screen are controlled.

In practice, the synchronization signals are logic pulse signals mainly defined by the polarity, positive or negative, of their pulses, their pulse recurrence frequency and duration.

Taking into account of the signals is generally performed on the one hand by means of automatic gain control loops, for vertical synchronization, and on the other hand, by means of phase-locked loops, for horizontal synchronization.

FIG. 1 illustrates a phase-locked loop 2 of known type, implementing a phase/frequency type comparator. Such a loop is for example implemented in circuits TDA 9103 and TDA 9105 produced by SGS-THOMSON Microelectronics, to process horizontal synchronization signals. It includes a comparator 4 of phase/frequency type, a charge pump 6, a capacitive filter 8, a voltage-controlled oscillator 10 (VCO), and a phase adjustment device 12.

Comparator 4 is used to compare an input pulse signal SIN received on an input 14, with a reference pulse signal SREF supplied by phase adjustment device 12.

Depending on the comparison, comparator 4 controls charge pump 6. This pump will charge or discharge filter 8, so that the voltage VREF produced by the filter will be representative of the result of the comparison between SIN and SREF.

Oscillator 10 generates, based on voltage VREF, a triangular output signal SOUT, the frequency of which is proportional to voltage VREF. Signal SOUT is provided, on the one hand, on an output 16 and, on the other hand, to device 12.

Device 12 generates a reference signal SREF based on signal SOUT and on a phase adjustment control signal ADJ. Signal ADJ is received on an input 18 and is used to position the fronts in signal SREF, the frequency of the pulses in signal SREF being identical to the recurrence frequency of signal SOUT.

Once signals SIN and SREF are in phase and at the same frequency, voltage VREF settles. Loop 2 has been "locked".

Finally, it should be noted that signal SIN is supplied by an input interface 20 which enables, typically, from a received synchronization signal HSYNC, generation of a signal SIN of fixed polarity. Signal HSYNC can be a horizontal synchronization signal with any polarity, or even a composite type signal, in which case signal SIN is obtained by extracting the horizontal synchronization pulses.

FIG. 2 illustrates an example of comparator 4, of phase/frequency type. The comparator could be a simple phase comparator. The use of a comparator of phase/frequency type enables avoiding a locking of the loop on a frequency which is a multiple of the frequency of input signal SIN. A problem is that this type of comparator is very sensitive to the absence of pulses and to the presence of additional pulses (such as equalizing pulses).

The comparator includes an input 22 for receiving signal SIN, an input 24 for receiving signal SREF, an output 26 for supplying a charge control signal HIGH and an output 28 for supplying a discharge control signal LOW. A two-input NOR-type logic gate 30 receives signals SIN and HIGH on its inputs. It provides a logic signal G1. A two-input NOR-type logic gate 32 receives on its inputs signal SREF and a logic signal G6, which is the inverse of signal LOW. It generates a logic signal G2.

An RS-type flip-flop 34 receives signal G1 on its set input S. It receives a RESET signal on its reset input R. It provides a logic signal G3 on its output Q. An RS-type flip-flop 36 receives signal G2 on its set input. Its receives signal RESET on its reset input. It provides a logic signal G4.

A four-input NOR-type logic gate 38 receives signals G1, G2, G3, and G4 on its inputs and provides a logic signal G5. Signal G5 is supplied to a delay circuit 39. Circuit 39 generates signal RESET, this signal being identical to signal G5, with a delay.

A three-input NOR-type gate 40 receives signals G1, G3 and RESET on its inputs and provides signal HIGH. Finally, a three-input NOR-type logic gate 42 receives signals G2, G4, and RESET on its inputs and provides signal G6. Signal G6 is supplied to an inverter 43 which provides signal LOW.

FIG. 3 illustrates an example of charge pump 6.

It includes an input 44 for receiving control signal HIGH, an input 46 for receiving control signal LOW, an output 48 connected to filter 8, a supply input 50 for receiving a positive supply potential VCC and a supply input 52 for receiving a ground potential GND.

Pump 6 includes two current mirrors 54 and 56.

A first mirror 54 is formed by two transistors 58 and 60, for example of PNP type. Their emitters are connected to input 50. Their bases are interconnected and connected to the collector of transistor 58. A switch 62, controlled by signal HIGH, enables connection of these bases to input 50.

A second mirror 56 is formed by two transistors 64 and 66, for example of NPN type. Their emitters are connected to input 52. Their bases are interconnected and connected to the collector of transistor 64. A switch 68, controlled by signal LOW, enables connection of these bases to input 52.

The collectors of transistors 58 and 64 arc interconnected by means of a resistor 70. The collectors of transistors 60 and 66 are connected to output 48.

The current i running through transistors 58 or 64 is equal to (VCC−Vbe)/R1, R1 being the value of resistor 70 and Vbe the base/emitter voltage of these transistors. When switch 62 is open, this current is copied in transistor 60. Filter 8 is then charged with a charge current Ich=i. When switch 68 is open, current i is copied in transistor 66. The filter is then discharged with a discharge current Idch=i.

FIG. 4 illustrates an example of filter 8. It is a C-R-C-type capacitive filter which includes a first input 72, connected to output 48 of the charge pump and to an input of oscillator 10, and a second input 74 receiving the ground potential.

Voltage VREF provided by the filter is the potential difference between inputs 72 and 74.

The filter includes a first capacitor 76, mounted between inputs 72 and 74. It also includes a resistor 78 and a second capacitor 80 mounted in series between these same inputs. Capacitor 80, of high value (for example, 4.7 microfarads or more) is used to maintain voltage VREF. It avoids having a fall (to potential GND) and a rise (to potential VCC) of voltage VREF that is too rapid when the edges in signals SIN and SREF are distant. Capacitor 76, of low value (for example, around 10 nanofarads), enables a quick adaptation of voltage VREF to the result of the comparison between signals SIN and SREF, when the edges in these signals are close.

In practice, the filter is implemented in discrete components, the other elements being currently implemented most of the time in the form of an integrated circuit.

Referring to FIGS. 5a to 5d, the operation of a portion of the loop will now be briefly described, and more specifically, the production of voltage VREF (illustrated in FIG. 5d) as a function of signals SIN and SREF (illustrated in FIG. 5a and 5b). FIG. 5c illustrates the current output of pump 6. It is assumed that signals SIN and SREF are positively biased. The loop is locked when the rising edges of signals SREF and SIN correspond in time. It is further assumed that the frequency of signal SOUT increases when voltage VREF increases, and conversely.

Assume that the loop is locked. The output of pump 6 is in high impedance. Signals HIGH and LOW are in a state such that the switches 62 and 68 are closed, that is, conductive. Here, it is assumed that switches 62 and 68 are closed when signals HIGH and LOW are respectively in the low state and in the high state, and that they are open otherwise. To implement switches 62 and 68, P-channel and N-channel MOS-type transistors, respectively, will for example be used. Voltage VREF is stabilized at a value between potentials VCC and GND. Signals G1, G2, G3, and G4 are in the high state.

If the frequency of the pulses in signal SIN increases, the rising edges in this signal will be ahead of the fronts in signal SREF as long as the loop is not locked on the new frequency.

If a rising edge appears in signal SIN, signal G1 switches to the low state. Accordingly, signal G3 switches to the low state and signal HIGH switches to the high state. Switch 62 is then opened, which causes a charging of the capacitive filter. At the following rising edge in signal SREF, signal G2 switches to the low state. This causes the switching to the low state of signal G4. Accordingly, signal LOW switches to the low state and signal G5 simultaneously switches to the high state. Subsequently, signal RESET switches to the high state. Signals G3 and G4 thus switch to the high state and switches 62 and 68 are closed. The pump output thus switches to high impedance until the following rising edge in signal SIN. Switch 62 is thus open on the rising edges of signal SIN and it is closed on the subsequent rising edges of signal SREF.

If the pulse frequency in signal SIN decreases, the rising edges in this signal will be delayed with respect to the fronts in signal SREF as long as the loop is not locked on the new frequency.

If a rising edge occurs in signal SREF, signal G2 switches to the low state. Accordingly, signal G4 switches to the low state and signal LOW switches to the low state. Switch 68 is then opened, which causes a discharge of the capacitive filter. At the following rising edge in signal SIN, signal G1 switches to the low state. This causes the switching to the low state of signal G3. Accordingly, signal HIGH switches to the high state and, simultaneously, signal G5 switches to the high state. Subsequently, signal RESET switches to the high state. Signals G3 and G4 thus switch to the high state and switches 62 and 68 are closed. The pump output thus switches to high impedance until the following rising edge of signal SREF. Switch 68 is thus open on the rising edges of signal SREF and it will be closed on the subsequent rising edges of signal SIN.

As it can be seen, voltage VREF is only stable if the loop is locked. Signal RESET is delayed, in order to generate pulses in control signals LOW and HIGH, even when the loop is locked. The duration of these pulses will be very short and will thus not considerably modify voltage VREF. This enables limitation of jitter phenomena in the phase-locked loop.

When there is a decrease, or even a cancellation, of the pulse frequency in signal SIN (for example, after a changing of display standard in the signal supplied to a monitor, or if the synchronization is lost), comparator 4 controls switch 68 so that the capacitive filter is discharged. This case is illustrated in FIG. 6 which represents voltage VREF. The value of resistor 78 is called R, the value of capacitor 80 is called C1, and the value of capacitor 76 is called C2. To begin with, capacitor 76 discharges rapidly according to a 1/R.C2 slope. Voltage VREF then decreases rapidly. Once capacitor 76 is discharged, capacitor 80 discharges more slowly, according to a $\Delta V/\Delta t = Idch/C1$ slope. To begin with, there will thus be a significant variation of the frequency in signal SOUT.

A problem arises since, typically, signal SOUT is used to control the horizontal deflectors (equivalent to inductances), by means of a power transistor. Typically, the voltage on the collector of this transistor is proportional to a variable supply voltage (called E hereafter), to the period of the horizontal synchronization signal and to the inverse of the square root of the equivalent inductance of the deflectors. In the field of monitors, for example, the horizontal frequency ranges between 15 and 150 kilohertz, voltage E is around a hundred volts and the equivalent inductance is around one millihenry. The peak voltage on the transistor collector thus is around one kilovolt.

In practice, the higher the frequency, the higher voltage E, which enables quicker control of the scanning. A problem is that the regulation of supply E is low, which may induce a transient peak voltage of several kilovolts on the power transistor collector, when the horizontal synchronization frequency varies. If the variations are too abrupt, the transistor may be destroyed, which makes the display inoperative.

A solution is to modify the filter in such a way that its response curve is less abrupt when the frequency varies, for example by increasing the value of capacitor 76. The reaction time of the pump is thus increased, which induces a risk of jitter between the input and reference signals. The charge and discharge current of the filter can also be decreased. A problem is that the stability of the loop is thus decreased and that the reaction time of the pump is increased.

SUMMARY OF THE INVENTION

An aim of the present invention is to provide an improved phase-locked loop, wherein the output signal frequency variations are limited, while being easily integrable in terms of components and size. For this purpose, it is provided to limit in time the charge and discharge of the filter, by acting upon the control signals of the pump switches. In this manner, the variations of voltage VREF are limited, the frequency of the output signal SOUT generated by oscillator 10 being proportional to this voltage.

Accordingly, the present invention provides a phase-locked loop including a comparator, a charge pump, a capacitive filter, a voltage-controlled oscillator and a phase adjustment device. The comparator compares the phases of an input pulse signal and of a reference pulse signal supplied by the phase adjustment device, and generates charge and discharge control signals. The charge pump is fit for charging or discharging the capacitive filter according to the charge and discharge control signals, the filter being charged or discharged when these signals are in a first state and insulated from the charge pump when they are in a second state. The loop includes a device for limiting the charge and discharge current of the capacitive filter, this device including windowing circuits for limiting the time during which the charge and discharge control signals are in their first state.

According to an embodiment, the limiting device includes a circuit for detecting the locking of the loop and the charge pump includes means for limiting the value of the charge or discharge current of the filter. The circuit for detecting the locking generates a locking detection signal representative of the fact that the loop is or is not locked, the detection signal being supplied to the windowing circuits and to the charge pump, to limit the time during which the charge and discharge control signals are in their first state when the loop is locked, and to limit the value of the charge or discharge current when the loop is not locked.

BRIEF DESCRIPTION OF THE DRAWINGS

Other advantages and characteristics of the present invention will appear from the following non-limiting description of examples of implementation of the present invention, taken in conjunction with the accompanying drawings, among which:

FIGS. 5a to 5d illustrate timing diagrams of signals implemented in the circuits illustrated in FIGS. 1 to 4, FIG. 6 illustrates a timing diagram of the voltage generated by the capacitive filter during a variation of the frequency of signals received by the loop, FIG. 7 schematically illustrates a first circuit for limiting the charge pump current according to the present invention, FIG. 12 illustrates a modified charge pump, FIGS. 13a to 13c illustrate timing diagrams of signals illustrating the modification of the voltage generated by a capacitive filter of a loop according to the state of the art and according to the present invention.

DETAILED DESCRIPTION

It will be assumed, in the following description of a device for limiting the variation of the voltage generated by the filter, that control signals LOW and HIGH which drive the charge pump control the opening of the pump switches when they are respectively in the low state and in the high state, and that they control the closing of these switches when they are in the inverse states.

Figure 7:
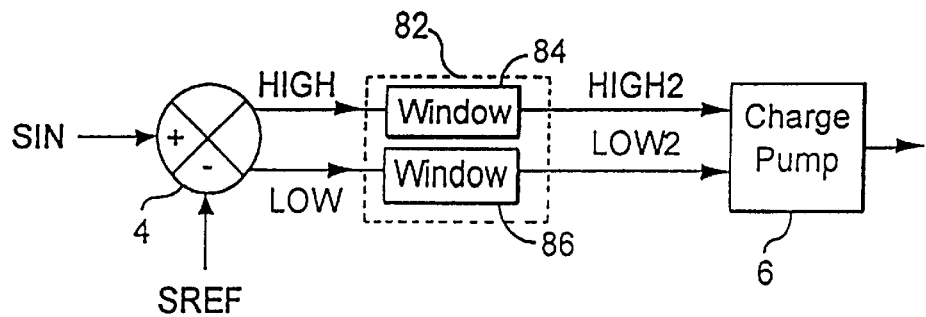

Device 82, illustrated in FIG. 7, enables limitation of the maximum time during which signals LOW and HIGH are respectively in the low state and in the high state. It is placed between comparator 4 of the loop and charge pump 6.

Figure 1:
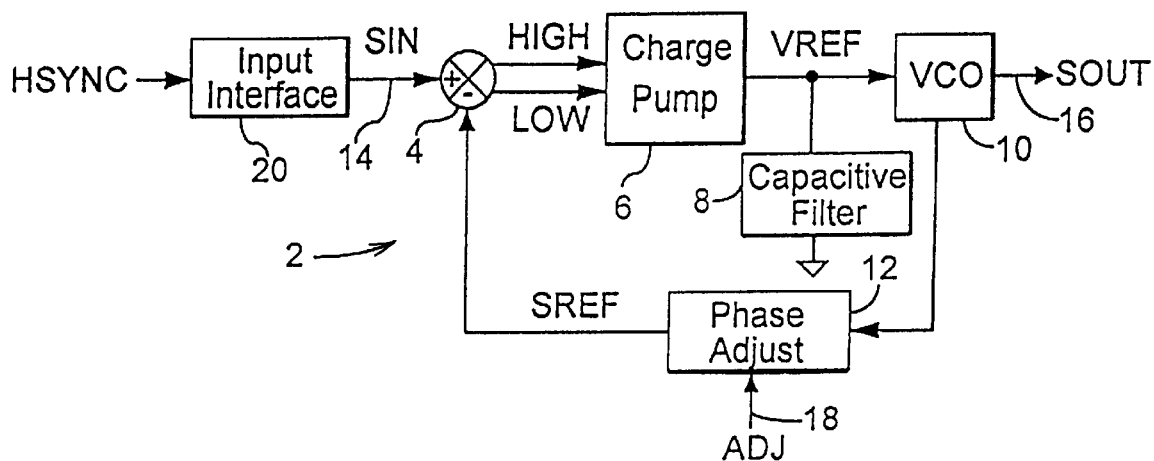
FIG. 1 illustrates a phase-locked loop according to the state of the art.
Figure 2:
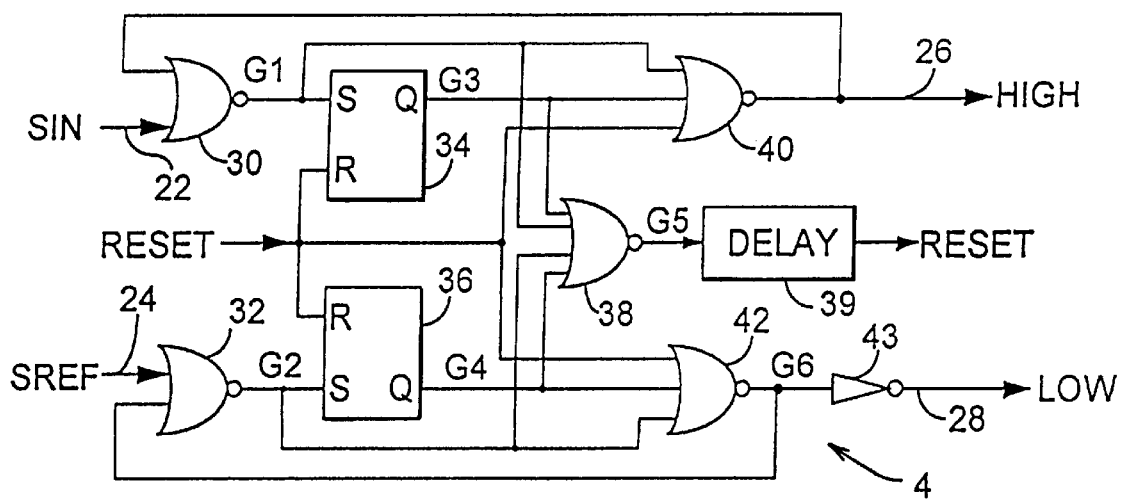
FIG. 2 illustrates a comparator of phase/frequency type according to the state of the art.
Figure 3:
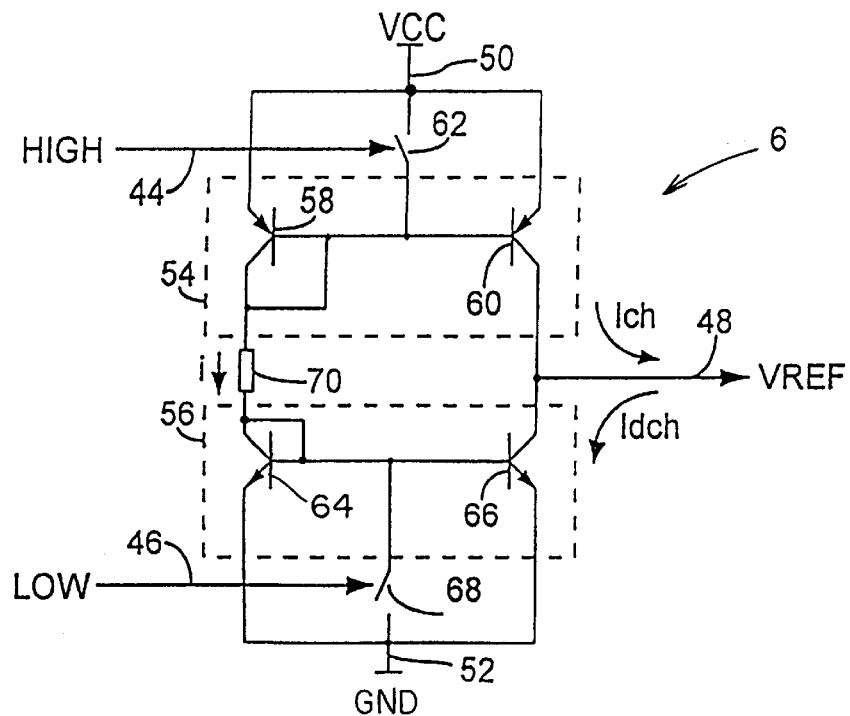
FIG. 3 illustrates a charge pump according to the state of the art.

Device 82 receives signals HIGH and LOW from the comparator placed upstream. It generates two derived control signals HIGH2 and LOW2 which are supplied to the charge pump placed upstream. With reference to FIG. 3, signals HIGH2 and LOW2 will be supplied to inputs 44 and 46 of the pump.

Device 82 includes two windowing circuits 84 and 86 which respectively receive signals HIGH and LOW, and which respectively generate signals HIGH2 and LOW2.

Figure 8:
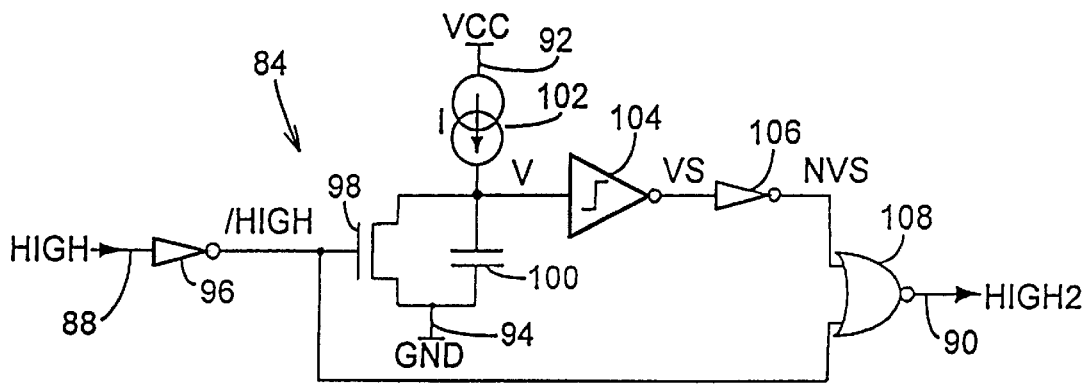
FIG. 8 illustrates a windowing circuit implemented in the limiting circuit illustrated in FIG. 7.

FIG. 8 illustrates an example of implementation of circuit 84. Circuit 86 will be similar in its constitution.

Circuit 84 includes an input 88 for receiving signal HIGH, an output 90 for providing signal HIGH2, a first supply input 92 for receiving a supply potential VCC and a second supply input 94 for receiving a reference (or ground) potential GND. An inverter 96, having one input and one output, receives signal HIGH on its input and provides a signal /HIGH on its output. Signal /HIGH is the inverse of signal HIGH.

An N-channel MOS-type transistor 98 receives signal /HIGH on its control gate. This transistor is used as a switch. It is on when signal /HIGH is in a first logic state. It is off when signal /HIGH is in a second logic state. In the example, transistor 98 being an N-channel transistor, the first state corresponds to the high state and the second state corresponds to the low state.

The source of transistor 98 is connected to input 94 and its drain is connected to a first terminal of a capacitor 100. Capacitor 100 has a second terminal which is connected to input 94. The value of capacitor 100 is called C.

A current source 102 is mounted between the first terminal of capacitor 100 and input 92. It supplies a current I. The voltage present across capacitor 100 is called V.

A comparator has an input connected to the first terminal of capacitor 100. In the example illustrated in FIG. 8, the comparator is an inverter 104. It provides a logic signal VS on an output. Signal VS is such that it is in a first state when voltage V is lower than a threshold Vthreshold and it is in a second state when voltage V is above this threshold. The first state corresponds, in the example, to the high state and the second state corresponds to the low state. An inverter 106 receives signal VS on an input. It provides a logic signal NVS on an output, this signal being the inverse of signal VS. A logic gate 108 of NOR type having two inputs and one output receives signals /HIGH and NVS on its inputs. It provides signal HIGH2 on its output.

When signal HIGH is in the low state, signal /HIGH is in the high state. The terminals of capacitors 100 are then short-circuited by means of transistor 98. Capacitor 100 will discharge, if it was charged. Once it is discharged, signals VS is in the HIGH state and HIGH2 is in the low state.

When signal HIGH switches to the high state, signal /HIGH changes states and transistor 98 blocks. Capacitor 100 then charges under constant current and voltage V increases with time. V(t)=I.t/C, with t=0 at the beginning of the switching to the high state of signal HIGH. Concurrently, signal HIGH2 switches to the high state, copying signal HIGH.

Tthreshold is the delay such that V(Threshold)= Vthreshold.

If signal HIGH is maintained in the high state for a time T such that T is lower than Threshold, then signal VS still is in the high state when signal HIGH returns to the low state. Signal HIGH2 then switches back to the low state. Concurrently, capacitor 100 is discharged by means of transistor 98.

If signal HIGH is maintained in the high state for a time T such that T is higher than Threshold, then signal VS switches to the low state once threshold Vthreshold has been reached. Signal HIGH2 then switches back to the low state. The charging time of the filter supplied by the charge pump located upstream of device 82 is thus limited.

Subsequently, when signal HIGH switches back to the low state, capacitor 100 is discharged by means of transistor 98. Signal VS switches back to the low state once threshold Vthreshold has been reached.

FIGS. 9 to 12 illustrate another embodiment of a limiting device 820 according to the present invention, wherein whether the loop is locked or not is taken into account.

Figure 9:
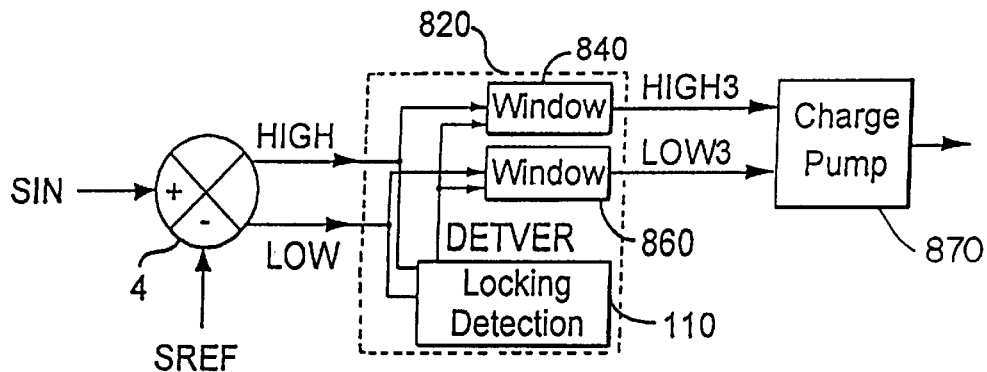
FIG. 9 illustrates a second charge pump current limiting circuit according to the present invention.

Device 820 illustrated in FIG. 9 enables, in a way similar to circuit 82 illustrated in FIG. 7, limitation of the maximum time during which signals LOW and HIGH are respectively in the low state and in the high state. It is placed between comparator 4 of the loop and a modified charge pump 870 (illustrated in FIG. 12). It includes two windowing circuits 840 and 860 which respectively receive signals HIGH and LOW and which respectively provide signals HIGH3 and LOW3. It also includes a locking detection circuit 110. This circuit 110 provides a logic signal DETVER to circuits 840 and 860, this signal being representative of whether the loop is locked or not.

Figure 10:
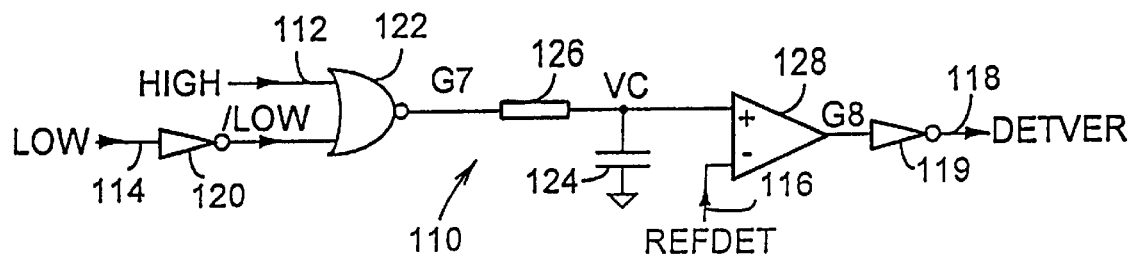
FIG. 10 illustrates a locking detection circuit implemented in the limiting circuit illustrated in FIG. 9.

Circuit 110, illustrated in FIG. 10, includes two inputs 112 and 114 for receiving signals HIGH and LOW. It provides signal DETVER on an output 118. Signal DETVER is in a first state if the loop is locked and in a second state otherwise. Here, it is assumed that the first state is the low state and that the second state is the high state.

An inverter 120 receives signal LOW on an input and provides on an output a logic signal /LOW, which is the inverse of signal LOW. A two-input logic gate 122 of NOR type receives signals HIGH and /LOW as inputs. It provides on an output a logic signal G7 which is integrated by an RC-type filter formed of a resistor 126 and of a capacitor 124 mounted in series between the output of gate 122 and the ground. The voltage across capacitor 124 is compared with a reference potential REFDET in a comparator 128. Potential REFDET will be included between the supply and reference potentials. The comparator provides a logic signal G8. Signal G8 is in a first state when the voltage across the capacitor is higher than potential REFDET and it is in a second state otherwise. An inverter 119 receives signal G8 on an input and provides signal DETVER on an output.

If the loop is locked, very short pulses are provided in signals LOW and HIGH upon occurrence of the edges in signals SREF and SIN. These pulses have for example a duration of around one hundred nanoseconds. Given the considered polarities for signals HIGH and LOW, these pulses correspond to high states in signals HIGH and /LOW.

Assume that the loop is locked and that signals HIGH and /LOW are in the low state. Capacitor 124 is charged. Signal G8 then is in the high state and signal DETVER is in the low state. If an edge appears in signal SIN or in signal SREF, a positive pulse will appear on one of the inputs of gate 122. Accordingly, the capacitor starts to discharge. If the duration of the pulse corresponds to the fact that the loop is locked, it will be short. The voltage drop across the capacitor will thus be low. It is enough to choose the value of potential REFDET so that it is lower than the voltage across the capacitor when the loop is locked, so that signal DETVER remains unchanged in this case. If the loop is not locked, longer pulses are provided. The capacitor is then discharged so that signal DETVER changes states.

Figure 11:
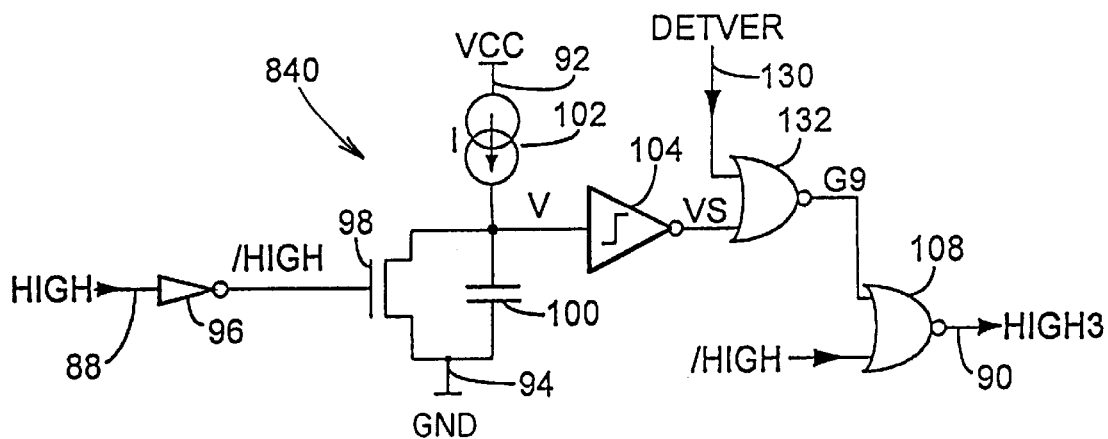
FIG. 11 illustrates a windowing circuit implemented in the limiting circuit illustrated in FIG. 9.

FIG. 11 illustrates windowing circuit 840 of circuit 820 of FIG. 9. Circuit 860 will be similar to circuit 840.

Circuit 840 includes the same elements as circuit 84 described with reference to FIG. 8, except for inverter 106. It includes, in addition, an input 130 for receiving signal DETVER. Inverter 106 is replaced with a two-input logic gate 132 of NOR type. This gate receives signals DETVER and VS on its inputs and provides, on an output, a logic signal G9. Gate 108 receives signals /HIGH and G9 on its inputs.

With respect to circuit 84 previously described, circuit 840 only limits the charge or discharge time of the capacitive filter when the loop is locked. This enables a fast loop response time to limited variations of dephasing between signals SIN and SREF. A jitter phenomenon is thus avoided in the loop. Conversely, when the loop is not locked and when it attempts to adjust on the input signal, the charge or discharge time is not limited, but the charge or discharge current in the pump is limited. FIG. 12 illustrates the pump 870 modified for this purpose.

Pump 870 of FIG. 12 includes, in addition to the elements described with reference to FIG. 3, an input 134 for receiving signal DETVER, a switch 136, and a resistor 138.

Resistor 138 is mounted in series with resistor 70 between transistors 58 and 64. Switch 136 is mounted in parallel to resistor 138. The switch is controlled by signal DETVER so that it is closed (that is, conductive) when signal DETVER is in the low state and open (that is, blocked) when signal DETVER is in the high state. Thus, when the loop is locked, resistor 138 is short-circuited and pump 870 has characteristics similar to those of pump 6. When the loop is not locked, resistor 138 adds to resistor 70 and the charge and discharge current is decreased.

FIGS. 13a to 13c illustrate the behavior of a loop according to the state of the art and according to the present invention confronted with a disappearing of the pulses in a received synchronization signal HSYNC (illustrated in FIG. 13a). It is assumed that the loop receiving signal HSYNC is locked prior to this disappearing. FIG. 13c illustrates signal DETVER.

FIG. 13b shows three voltages provided by the filter of a loop according to whether the loop according to the state of the art (curve VREF1), a loop implementing the present invention without taking the pump locking into account (curve VREF2), and a loop implementing the present invention and taking the pump locking into account (curve VREF3), is considered. The curves are shifted to make reading of them easier.

Figure 4:
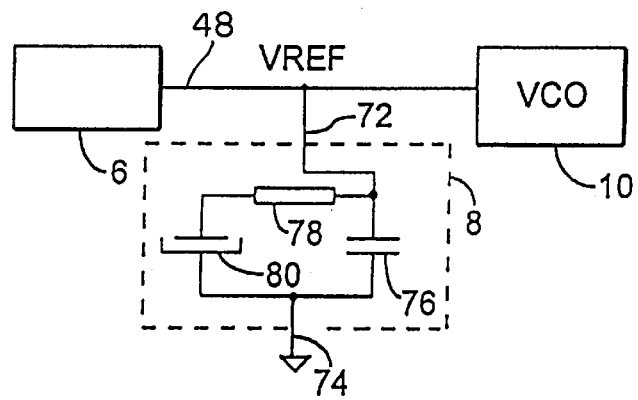
FIG. 4 illustrates a capacitive filter according to the state of the art.

In the first case, at the time when the pulses disappear (time t1 in FIG. 13b), voltage VREF1 drops very rapidly according to a 1/R.C2 slope. Then, the capacitor with the lowest value being discharged (capacitor 76 of FIG. 4), capacitor 80 discharges with a smaller slope $\Delta V/\Delta t = Idch/C1$.

In the second case, voltage VREF2 drops rapidly, with the same slope 1/R.C2 as in the case illustrated by curve VREF1. This drop stops before the capacitor with the lowest value is discharged, under the action of the device for limiting the charge or discharge time. Voltage VREF2 stabilizes and no longer varies if no pulse appears in signal SIN.

In the third case, voltage VREF3 follows the same variations as curve VREF2, as long as the loss of locking has not been detected. Once it has been detected, capacitor 76 keeps on discharging with a smaller slope $\Delta V/\Delta t = I'dch/C1$, with $I'dch = (VCC-Vbe)/(R1+R2) < Idch$, R2 being the value of resistor 138. Then, capacitor 80 also discharges, with a smaller discharge slope than in the case of curve VREF1. If no pulse appears in signal HSYNC, the filter will be completely discharged, as it is the case for the loop according to the state of the art. An advantage with respect to the case illustrated by curve VREF2 is that, once the discharge has been performed, the voltage generated by the filter and, more generally, the state of the loop, will be known. This may be advantageous, for example to perform tests at the output of a monitor production line. Further, a low voltage VREF corresponds to a lower horizontal scanning frequency. Limiting this voltage enables to limit the stress of the components driven by the loop.

Thus, the circuits according to the present invention enable to obtain a fast adaptation of the pump to the low variations of the input signal (which enables to have a good stability of the pump), while limiting fast significant variations of the frequency of the signal provided at the loop output. Of course, the present invention is not limited to the specific examples described. Thus, the polarity of the generated signals can be modified, as well as the gates which generate these signals, without leaving the field of the present invention.

The present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A phase-locked loop including a comparator, a charge pump, a capacitive filter, a voltage-controlled oscillator and a phase adjustment device, the comparator comparing the phases of an input pulse signal and of a reference pulse signal supplied by the phase adjustment device, and generating charge and discharge control signals, the charge pump being capable of charging or discharging the capacitive filter according to the charge and discharge control signals, the filter being charged or discharged when these signals are in a first state and insulated from the charge pump when they are in a second state, including a device for limiting the charge and discharge current of the capacitive filter, this device including windowing circuits for limiting a first time period during which the charge and discharge control signals are in the first state, wherein the limiting device includes a circuit for detecting the locking of the loop and wherein the charge pump includes means for limiting the value of the charge or discharge current of the filter, the circuit for detecting the locking generating a locking detection signal representative of the fact that the loop is or is not locked, the detection signal being supplied to the windowing circuits and to the charge pump, to limit the first time period during which the charge and discharge control signals are in their first state to less than a second time period during which the loop is locked, and to limit the value of the charge or discharge current when the loop is not locked.

2. A loop according to claim 1, wherein the windowing circuits generate, based on the charge and discharge control signals, derived charge and discharge control signals, the states of which reproduce the states of the control signals, the derived control signals driving the charge pump, and the windowing circuits including limiting means for imposing a modification of the state of these derived control signals so that the filter is insulated from the pump when it has been charged or discharged during a delay defined by these limiting means.

3. A loop according to claim 2, wherein the windowing circuits receive the locking detection signal, and wherein the limiting means are inoperative when this signal is representative of the fact that the loop is not locked.

4. A loop according to claim 1, wherein the charge pump receives the locking detection signal and includes resistors mounted in series and enabling of the value of the charge or discharge current, the detection signal driving switching means for short-circuiting or connecting to at least one of the resistors so as to increase or decrease the charge or discharge current.

5. A phase-locked loop including a comparator, a charge pump, a capacitive filter, a voltage-controlled oscillator and a phase adjustment device, the comparator comparing the phases of an input pulse signal and of a reference pulse signal supplied by the phase adjustment device, and generating charge and discharge control signals, the charge pump being capable of charging or discharging the capacitive filter according to the charge and discharge control signals, the filter being charged or discharged when these signals are in a first state and insulated from the charge pump when they are in a second state, including a device for limiting the charge and discharge current of the capacitive filter, this device including windowing circuits for limiting a time during which the charge and discharge control signals are in the first state, wherein the limiting device includes a circuit for detecting the locking of the loop, wherein the charge pump includes means for limiting the value of the charge or discharge current of the filter, the circuit for detecting the locking generating a locking detection signal representative of the fact that the loop is or is not locked, the detection signal being supplied to the windowing circuits and to the charge pump, to limit the time during which the charge and discharge control signals are in their first state when the loop is locked, and to limit the value of the charge or discharge current when the loop is not locked, and wherein the windowing circuits each comprise an input terminal for receiving an input signal, a first supply input terminal, a second supply input terminal and an output terminal.

6. A loop according to claim 5 wherein each windowing circuit includes a transistor having a control gate for receiving the input signal.

7. A loop according to claim 6 wherein said transistor is an N-channel MOS-type transistor.

8. A loop according to claim 7 wherein each windowing circuit also comprises a current source and a capacitor connected in series between said first and second supply terminals, said capacitor connected between the source and drain of said MOS-type transistor.

9. A loop according to claim 8 wherein each windowing circuit further comprises a comparator and a logic gate.

10. A loop according to claim 9 wherein said comparator connects from said transistor and said logic gate has one input coupled by way of an inverter from the output of the comparator.

11. A loop according to claim 10 wherein a second input of the logic gate coupled from the input terminal by way of a second inverter.

12. A loop according to claim 11 wherein said logic gate is a NOR gate.

13. A phase-locked loop including a comparator, a charge pump, a capacitive filter, a voltage-controlled oscillator and a phase adjustment device, the comparator comparing the phases of an input pulse signal and of a reference pulse signal supplied by the phase adjustment device, and generating charge and discharge control signals, the charge pump being capable of charging or discharging the capacitive filter according to the charge and discharge control signals, the filter being charged or discharged when these signals are in a first state and insulated from the charge pump when they are in a second state, including a device for limiting the charge and discharge current of the capacitive filter, this device including windowing circuits for limiting a time during which the charge and discharge control signals are in the first state, wherein the limiting device includes a circuit for detecting the locking of the loop, wherein the charge pump includes means for limiting the value of the charge or discharge current of the filter, the circuit for detecting the locking generating a locking detection signal representative of the fact that the loop is or is not locked, the detection signal being supplied to the windowing circuits and to the charge pump, to limit the time during which the charge and discharge control signals are in their first state when the loop is locked, and to limit the value of the charge or discharge current when the loop is not locked, and wherein the circuit for detecting the locking of the loop includes a two input logic gate for receiving respective HIGH and LOW signals and a comparator.

14. A loop according to claim 13 including an inverter coupled between the LOW input and one input of the logic gate, said logic gate being a NOR gate.

15. A loop according to claim 14 including a RC-type filter comprising a resistor and a capacitor coupled between the output of the NOR gate and one input of the comparator.

16. A loop according to claim 15 wherein the other input of the comparator couples to a reference potential.

17. A loop according to claim 16 wherein the windowing circuits each comprise a MOS transistor, a current source and a capacitor coupled in series with the capacitor coupled between the drain and source of the transistor.

18. A loop according to claim 17 wherein each windowing circuit further comprises a comparator, and first and second logic gates.

19. A loop according to claim 18 wherein the output of the circuit for detecting the locking of the loop connects to one input of the first logic gate.

20. A loop according to claim 19 wherein both said first and second logic gates are NOR gates.

21. A phase-locked loop including a comparator, a charge pump, a voltage-controlled oscillator, a capacitive filter for providing a voltage to the voltage-controlled oscillator and a phase adjustment device, the comparator comparing the phases of an input pulse signal and of a reference pulse signal supplied by the phase adjustment device, and generating charge and discharge control signals, the charge pump being capable of charging or discharging the capacitive filter according to the charge and discharge control signals, the filter being charged or discharged when these signals are in a first state and insulated from the charge pump when they are in a second state, including a device for limiting the charge and discharge current of the capacitive filter, this device including windowing circuits for limiting, to a predetermined length of time, a period during which the charge and discharge control signals are in the first state, wherein the limiting device includes a circuit for detecting the locking of the loop and wherein the charge pump includes means for limiting the value of the charge or discharge current of the filter when the loop is not locked.

22. A phase-locked loop including a comparator, a charge pump, a voltage-controlled oscillator, a capacitive filter for providing a voltage to the voltage-controlled oscillator and a phase adjustment device, the comparator comparing the phases of an input pulse signal and of a reference pulse signal supplied by the phase adjustment device, and generating charge and discharge control signals, the charge pump being capable of charging or discharging the capacitive filter according to the charge and discharge control signals, the filter being charged or discharged when these signals are in a first state and insulated from the charge pump when they are in a second state, including a device for limiting the charge and discharge current of the capacitive filter, this device including windowing circuits for limiting, to a predetermined length of time, a period during which the charge and discharge control signals are in the first state, wherein the limiting device includes a circuit for detecting the locking of the loop, wherein the charge pump includes means for limiting the value of the charge or discharge current of the filter, and wherein the windowing circuits generate, based on the charge and discharge control signals, derived charge and discharge control signals, the states of which reproduce the states of the control signals, the derived control signals driving the charge pump, and the windowing circuits including limiting means for imposing a modification of the state of these derived control signals so that the filter is insulated from the pump when it has been charged or discharged during a delay defined by these limiting means.

23. A loop according to claim 21, wherein the windowing circuits receive the locking detection signal, and wherein the limiting means are inoperative when this signal is representative of the fact that the loop is not locked.

24. A loop according to claim 21, wherein the charge pump receives the locking detection signal and includes resistors mounted in series and enabling of the value of the charge or discharge current, the detection signal driving switching means for short-circuiting or connecting to at least one of the resistors so as to increase or decrease the charge or discharge current.

25. A phase-locked loop including a comparator, a charge pump, a voltage-controlled oscillator, a capacitive filter for providing a voltage to the voltage-controlled oscillator and a phase adjustment device, the comparator comparing the phases of an input pulse signal and of a reference pulse signal supplied by the phase adjustment device, and generating charge and discharge control signals, the charge pump being capable of charging or discharging the capacitive filter according to the charge and discharge control signals, the filter being charged or discharged when these signals are in a first state and insulated from the charge pump when they are in a second state, including a device for limiting the charge and discharge current of the capacitive filter, this device including windowing circuits for limiting, to a predetermined length of time, a period during which the charge and discharge control signals are in the first state, wherein the limiting device includes a circuit for detecting the locking of the loop, wherein the charge pump includes means for limiting the value of the charge or discharge current of the filter, and wherein each windowing circuit comprises an input terminal for receiving an input signal, a first supply input terminal, a second supply input terminal and an output terminal, wherein the windowing circuit includes a transistor having a control gate for receiving the input signal, wherein said transistor is an N-channel MOS-type transistor, wherein the windowing circuit also comprises a current source and a capacitor connected in series between said first and second supply terminals, said capacitor connected between the source and drain of said MOS-type transistor.

26. A loop according to claim 25 wherein each windowing circuit further comprises a comparator and a logic gate, wherein said comparator connects from said transistor and said logic gate has one input coupled by way of an inverter from the output of the comparator, wherein a second input of the logic gate coupled from the input terminal by way of a second inverter, wherein said logic gate is a NOR gate.

27. A phase-locked loop including a comparator, a charge pump, a voltage-controlled oscillator, a capacitive filter for providing a voltage to the voltage-controlled oscillator and a phase adjustment device, the comparator comparing the phases of an input pulse signal and of a reference pulse signal supplied by the phase adjustment device, and generating charge and discharge control signals, the charge pump being capable of charging or discharging the capacitive filter according to the charge and discharge control signals, the filter being charged or discharged when these signals are in a first state and insulated from the charge pump when they are in a second state, including a device for limiting the charge and discharge current of the capacitive filter, this device including windowing circuits for limiting, to a predetermined length of time, a period during which the charge and discharge control signals are in the first state, wherein the limiting device includes a circuit for detecting the locking of the loop, wherein the charge pump includes means for limiting the value of the charge or discharge current of the filter, and wherein the circuit for detecting the locking of the loop includes a two input logic gate for receiving respective HIGH and LOW signals and a comparator, including an inverter coupled between the LOW input and one input of the logic gate, said logic gate being a NOR gate, including a RC-type filter comprising a resistor and a capacitor coupled between the output of the NOR gate and one input of the comparator, wherein the other input of the comparator couples to a reference potential.

28. A loop according to claim 27 wherein each windowing circuit comprises a MOS transistor, a current source and a capacitor coupled in series with the capacitor coupled between the drain and source of the transistor, wherein said windowing circuit further comprises a comparator, and first and second logic gates, wherein the output of the circuit for detecting the locking of the loop connects to one input of the first logic gate, wherein both said first and second logic gates are NOR gates.

29. A phase-locked loop including a comparator, a charge pump, a capacitive filter, a voltage-controlled oscillator and a phase adjustment device, the comparator comparing the phases of an input pulse signal and of a reference pulse signal supplied by the phase adjustment device, and generating charge and discharge control signals, the charge pump being capable of charging or discharging the capacitive filter according to the charge and discharge control signals, the filter being charged or discharged when these signals are in a first state and insulated from the charge pump when they are in a second state, including a device for limiting the charge and discharge current of the capacitive filter, this device including windowing circuits for limiting a first time period during which the charge and discharge control signals are in the first state, wherein the limiting device includes a circuit for detecting the locking of the loop and wherein the charge pump includes means for limiting the value of the charge or discharge current of the filter, the circuit for detecting the locking generating a locking detection signal representative of the fact that the loop is or is not locked, the detection signal being supplied to the windowing circuits and to the charge pump, to limit the first time period during which the charge and discharge control signals are in their first state to less than a second time period during which the loop is locked, and to limit the value of the charge or discharge current when the loop is not locked, wherein the windowing circuits receive the locking detection signal, and wherein the limiting means are inoperative when this signal is representative of the fact that the loop is not locked.

30. A phase-locked loop including a comparator, a charge pump, a capacitive filter, a voltage-controlled oscillator and a phase adjustment device, the comparator comparing the phases of an input pulse signal and of a reference pulse signal supplied by the phase adjustment device, and generating charge and discharge control signals, the charge pump being capable of charging or discharging the capacitive filter according to the charge and discharge control signals, the filter being charged or discharged when these signals are in a first state and insulated from the charge pump when they are in a second state, including a device for limiting the charge and discharge current of the capacitive filter, this device including windowing circuits for limiting a first time period during which the charge and discharge control signals are in the first state, wherein the limiting device includes a circuit for detecting the locking of the loop and wherein the charge pump includes means for limiting the value of the charge or discharge current of the filter, the circuit for detecting the locking generating a locking detection signal representative of the fact that the loop is or is not locked, the detection signal being supplied to the windowing circuits and to the charge pump, to limit the first time period during which the charge and discharge control signals are in their first state when the loop is locked, and to limit the value of the charge or discharge current to less than a second period during which the loop is not locked, wherein the charge pump receives the locking detection signal and includes resistors mounted in series and enabling of the value of the charge or discharge current, the detection signal driving switching means for connecting a short-circuit to or for removing a short-circuit from at least one of the resistors so as to increase or decrease the charge or discharge current.

31. A phase-locked loop including a comparator, a charge pump, a capacitive filter, a voltage-controlled oscillator and a phase adjustment device, the comparator comparing the phases of an input pulse signal and of a reference pulse signal supplied by the phase adjustment device, and generating charge and discharge control signals, the charge pump being capable of charging or discharging the capacitive filter according to the charge and discharge control signals, the filter being charged or discharged, when these signals are in a first state and insulated from the charge pump when they are in a second state, this device including windowing circuits for limiting a first time period during which the charge and discharge control signals are in the first state, wherein the limiting device includes a circuit for detecting the locking of the loop and wherein, the circuit for detecting the locking generating a locking detection signal representative of the fact that the loop is or is not locked, the detection signal being supplied to the windowing circuits, to limit the first time period during which the charge and discharge control signals are in their first state to less than a second time period during which the loop is locked.

* * * * *